US00RE46180E

(19) United States
(12) Reissued Patent
Mather et al.

(10) Patent Number: US RE46,180 E
(45) Date of Reissued Patent: Oct. 18, 2016

(54) THREE AXIS MAGNETIC FIELD SENSOR

(71) Applicant: EVERSPIN TECHNOLOGIES, INC., Chandler, AZ (US)

(72) Inventors: Phillip Mather, Phoenix, AZ (US); Jon Slaughter, Tempe, AZ (US); Nicholas Rizzo, Gilbert, AZ (US)

(73) Assignee: EVERSPIN TECHNOLOGIES, INC., Chandler, AZ (US)

(21) Appl. No.: 14/638,583

(22) Filed: Mar. 4, 2015

Related U.S. Patent Documents

Reissue of:
(64) Patent No.: 8,390,283
Issued: Mar. 5, 2013
Appl. No.: 12/567,496
Filed: Sep. 25, 2009

(51) Int. Cl.
*G01R 33/02* (2006.01)
*G01R 33/00* (2006.01)
*H01L 27/22* (2006.01)
*H01L 43/08* (2006.01)
(Continued)

(52) U.S. Cl.
CPC ..... *H01L 27/22* (2013.01); *B82Y 25/00* (2013.01); *G01R 33/093* (2013.01); *H01L 43/08* (2013.01)

(58) Field of Classification Search
CPC ..... G01R 33/093; B82Y 25/00; H01L 27/22; H01L 43/08
USPC ..... 324/252, 244, 260
See application file for complete search history.

(56) References Cited

U.S. PATENT DOCUMENTS 5,343,143 A * 8/1994 Voisine ..... G01R 11/067 324/107
5,739,988 A * 4/1998 Gill ..... B82Y 10/00 360/324.12
5,850,624 A * 12/1998 Gard ..... G01R 33/0206 33/356
(Continued)

FOREIGN PATENT DOCUMENTS

CN 101221849 A 7/2008
EP 0427171 A2 * 5/1991 ..... B82Y 25/00
(Continued)

OTHER PUBLICATIONS

International Search Report and Written Opinion issued in corresponding International Application No. PCT/US2010/050398, mailed Nov. 22, 2010 (8 pages).
(Continued)

*Primary Examiner* — Anjan K. Deb
(74) *Attorney, Agent, or Firm* — Bookoff McAndrews, PLLC

(57) ABSTRACT

Three bridge circuits (101, 111, 121), each include magnetoresistive sensors coupled as a Wheatstone bridge (100) to sense a magnetic field (160) in three orthogonal directions (110, 120, 130) that are set with a single pinning material deposition and bulk wafer setting procedure. One of the three bridge circuits (121) includes a first magnetoresistive sensor (141) comprising a first sensing element (122) disposed on a pinned layer (126), the first sensing element (122) having first and second edges and first and second sides, and a first flux guide (132) disposed non-parallel to the first side of the substrate and having an end that is proximate to the first edge and on the first side of the first sensing element (122). An optional second flux guide (136) may be disposed non-parallel to the first side of the substrate and having an end that is proximate to the second edge and the second side of the first sensing element (122).

60 Claims, 4 Drawing Sheets

(51) Int. Cl.

| | |
|---|---|
| ***B82Y 25/00*** | (2011.01) |
| ***G01R 33/09*** | (2006.01) |

(56) References Cited

U.S. PATENT DOCUMENTS

| | | | | |
|---|---|---|---|---|
| 5,893,981 | A * | 4/1999 | Dovek | G01R 33/09 216/22 |
| 5,930,087 | A * | 7/1999 | Brug | B82Y 10/00 360/321 |
| 6,501,678 | B1 * | 12/2002 | Lenssen et al. | B82Y 25/00 257/E27.005 |
| 6,577,124 | B2 * | 6/2003 | Coehoorn | B82Y 10/00 324/252 |
| 6,724,584 | B2 * | 4/2004 | Mack | B82Y 10/00 360/324.11 |
| 7,116,100 | B1 * | 10/2006 | Mock et al. | 324/207.25 |
| 7,235,968 | B2 | 6/2007 | Popovic et al. | |
| 7,259,556 | B2 | 8/2007 | Popovic et al. | |
| 7,505,233 | B2 | 3/2009 | Grimm et al. | |
| 7,710,113 | B2 * | 5/2010 | Crolly et al. | 324/252 |
| 7,915,886 | B2 * | 3/2011 | Stolfus et al. | 324/174 |
| 7,956,604 | B2 * | 6/2011 | Ausserlechner | 324/207.21 |
| 8,093,886 | B2 * | 1/2012 | Okada et al. | 324/207.21 |
| 8,269,491 | B2 * | 9/2012 | Cummings et al. | 324/252 |
| 8,278,919 | B2 * | 10/2012 | Fischer et al. | 324/244 |
| 2004/0137275 | A1 | 7/2004 | Jander et al. | |
| 2005/0013060 | A1 * | 1/2005 | Grimm | G11B 5/39 360/324 |
| 2006/0087318 | A1 * | 4/2006 | Crolly et al. | 324/252 |
| 2006/0103381 | A1 * | 5/2006 | Schmollngruber et al. | 324/252 |
| 2007/0209437 | A1 | 9/2007 | Xue et al. | |
| 2009/0115405 | A1 | 5/2009 | Guo et al. | |
| 2010/0181999 | A1 * | 7/2010 | Sudai | G06F 21/86 324/239 |

FOREIGN PATENT DOCUMENTS

| | | | |
|---|---|---|---|
| EP | 2006700 | A2 | 12/2008 |
| JP | 2005-216390 | A | 8/2005 |
| JP | 2008-525789 | A | 7/2008 |
| JP | 2009-216390 | A | 9/2009 |
| TW | 584735 | B | 4/2004 |
| TW | 200604520 | | 2/2006 |
| WO | WO 2008/148600 | A1 | 12/2008 |
| WO | WO 2009/048018 | A1 | 4/2009 |

OTHER PUBLICATIONS

International Search Report on Patentability issued in corresponding International Application No. PCT/US2010/050398, mailed Apr. 5, 2012 (7 pages).

* cited by examiner

THREE AXIS MAGNETIC FIELD SENSOR

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*PRIORITY*

*This application is a reissue application of U.S. Pat. No. 8,390,283 B2, which issued on Mar. 5, 2013, from U.S. patent application Ser. No. 12/567,496, filed on Sep. 25, 2009, the entire disclosure of which is expressly incorporated herein by reference.*

*More than one reissue application has been filed for the reissue of U.S. Pat. No. 8,390,283 B2. The reissue applications are the present application, i.e., U.S. Reissue application Ser. No. 14/638,583, and U.S. Reissue application Ser. No. 15/165,600, which is a continuation reissue application of the present application.*

FIELD

The present invention generally relates to the field of magnetoelectronic devices and more particularly to CMOS-compatible magnetoelectronic field sensors used to sense magnetic fields in three orthogonal directions.

BACKGROUND

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications generally consist of anisotropic magnetoresistance (AMR) based devices. In order to arrive at the required sensitivity and reasonable resistances that match well with CMOS, the sensing units of such sensors are generally on the order of square millimeters in size. For mobile applications, such AMR sensor configurations are costly, in terms of expense, circuit area, and power consumption.

Other types of sensors, such as Hall effect sensors, giant magnetoresistance (GMR) sensors, and magnetic tunnel junction (MTJ) sensors, have been used to provide smaller profile sensors, but such sensors have their own concerns, such as inadequate sensitivity and being effected by temperature changes. To address these concerns, MTJ sensors and GMR sensors have been employed in a Wheatstone bridge structure to increase sensitivity and to eliminate temperature dependent resistance changes. Many magnetic sensing technologies are inherently responsive to one orientation of applied field, to the exclusion of orthogonal axes. Indeed, two-axis magnetic field sensors have been developed for electronic compass applications to detect the earth's field direction by using a Wheatstone bridge structure for each sense axis.

For example, Hall sensors are generally responsive to out-of-plane field components normal to the substrate surface, while magneto-resistive sensors are responsive to in-plane applied magnetic fields. Utilizing these responsive axes, development of a small footprint three axis sensing solution typically involves a multi chip module with one or more chips positioned at orthogonal angles to one another. For magnetoresistive sensors, the orthogonal in-plane components may be achieved with careful sensor design, but the out-of-plane response is commonly garnered through vertical bonding or solder reflow to contact a secondary chip that has be mounted vertically. As the size of the vertically bonded chip is typically dominated by the pad pitch as determined from the handling constraints, such a technique results in a large vertical extent of the finished package, high die and assembly costs, and makes chip scale packaging difficult and costly as through chip vias must be incorporated.

Accordingly, a need exists for an improved design and fabrication process for forming a single chip magnetic sensor that is responsive an applied magnetic field in three dimensions. There is also a need for a three-axis sensor that can be efficiently and inexpensively constructed as an integrated circuit structure for use in mobile applications. There is also a need for an improved magnetic field sensor and fabrication to overcome the problems in the art, such as outlined above. Furthermore, other desirable features and characteristics of the present invention will become apparent from the subsequent detailed description and the appended claims, taken in conjunction with the accompanying drawings and this background.

BRIEF DESCRIPTION OF THE DRAWINGS

Embodiments of the present invention will hereinafter be described in conjunction with the following drawing figures, wherein like numerals denote like elements.

Figure 1:
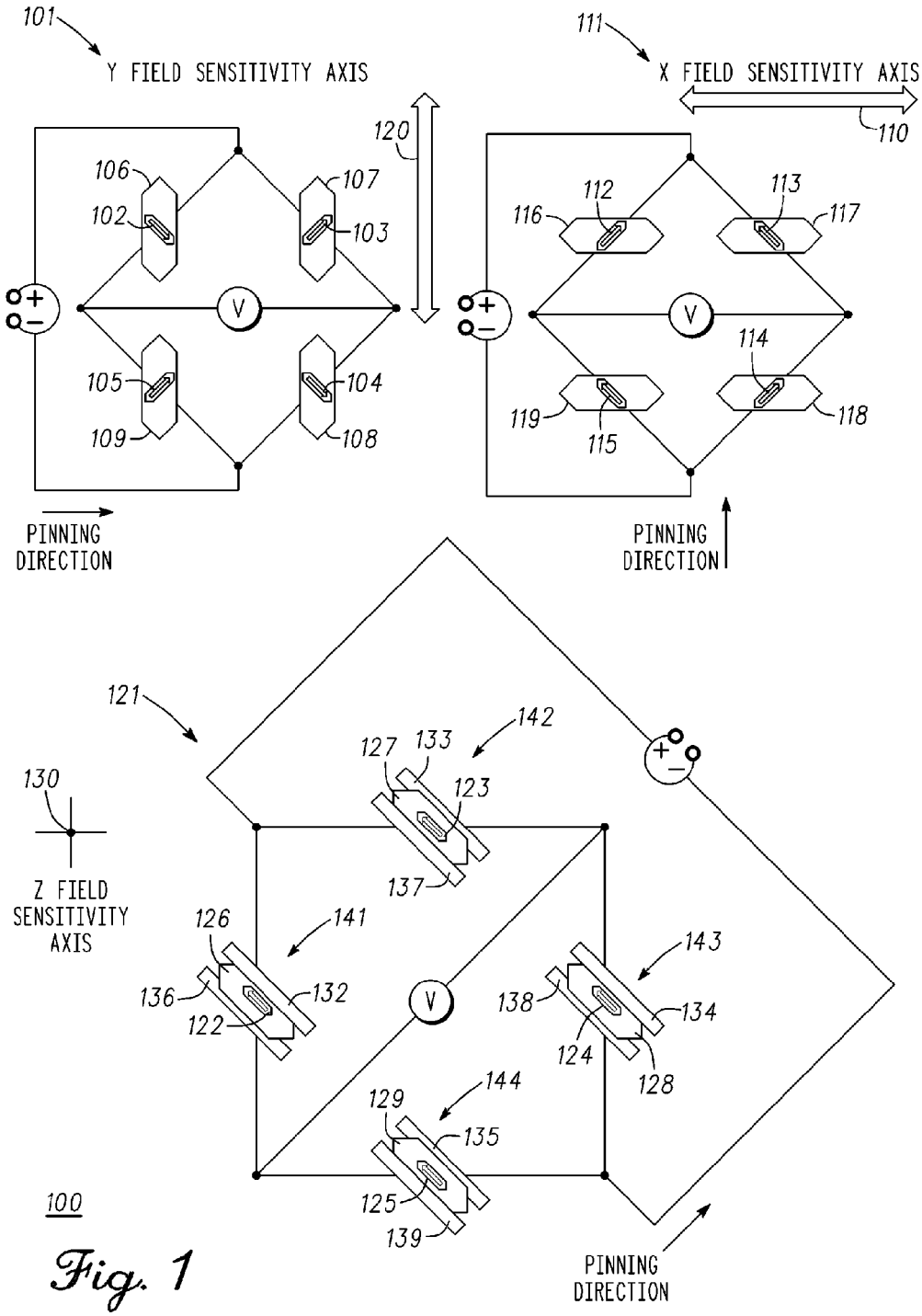
FIG. 1 illustrates an electronic compass structure which uses differential sensors formed from three bridge structures with MTJ sensors in accordance with an exemplary embodiment.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

SUMMARY

A ferromagnetic thin-film based magnetic field sensor includes a first magnetoresistive sensor comprising a substrate having a planar surface, and a first sensing element having a first side lying parallel to the planar surface of the substrate, the first sensing element having a second side opposed to the first side and having first and second opposed edges; and a first flux guide disposed non-parallel to the first side of the substrate and having an end that is proximate to the first edge and the first side of the first sensing element. An optional second flux guide may be disposed non-parallel to the first side of the substrate and having an end that is proximate to the second edge and the second side of the first sensing element.

In another exemplary embodiment, a ferromagnetic thin-film based magnetic field sensor includes first, second, and third magnetoresistive sensors. The first magnetic tunnel junction sensor includes a first pinned layer and a first sensing element formed on the first pinned layer, the second magnetic tunnel junction sensor includes a second pinned layer and a second sensing element formed on the second pinned layer and orthogonal to the first sensing element, and the third magnetic tunnel junction sensor includes a third pinned layer and a third sensing element formed on the third pinned layer, the third pinned layer disposed at about 45 degrees to each of the first and second pinned layers, the third sensing element having first and second edges and first and second sides. A flux guide is disposed non-parallel to a planar surface of the substrate and has an end that is proximate to the first edge and the first side of the third sensing element.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Through the integration of high aspect ratio vertical bars (flux guides) of a high permeability material, for example, nickel iron (NiFe), whose ends terminate in close proximity to opposed edges and opposite sides of a magnetic sense element, a portion of the Z axis field can be brought into the XY plane. These flux guides serve to capture magnetic flux from an applied field oriented in the Z direction, and in so doing, bend the field lines in a substantially horizontal manner near the ends of the flux guides. Through asymmetric positioning of the flux guides, e.g., the flux guide segment above the left edge of sense elements in two legs of the four legs of a Wheatstone bridge, and the flux guide above the right edge of sense elements in the other two legs, the horizontal components may act in an opposite directions for the two pairs of legs resulting in a strong differential signal. A field applied in the X or Y direction will project equally on all four legs of the bridge and hence be subtracted out and not contribute to the final sensor signal. Separate bridges are included elsewhere on the magnetic sensor chip for determining the X and Y components of the magnetic signal, and in this manner, a field with components in all three spatial orientations can be accurately determined by a single chip magnetoresistive sensing module, for example, based on magnetic tunnel junction (MTJ) sense elements. Finite Element Method (FEM) simulations have shown that a pair of high aspect ratio flux guides, e.g., 25 nm wide by 500 nm high and extending several microns in the third direction, when optimally positioned will provide a signal on an individual element that is about 80% of the of the signal measured from an in plane (x axis) field of the same strength. Additional signal may be obtained through closer proximity of the flux guide to the sensor, increases in the flux guide height, and additional shaping of the guide geometry. One example is to add horizontal segments parallel to the sense element which extend over the edges of the sense element. Other examples are to form a U which is placed with the interior horizontal segment aligned with the outer edge of the sense element, angled termination of the vertical segments to extend the flux guide partially in the plane of the sense element, and a similarly placed box structure. These geometries serve to further enhance the horizontal component of the guided flux and move it to a more central region of the sensor. A structure with individual 25 nm wide vertical bars utilized as flux guides is tolerant to overlay errors and produces an apparent x to z field conversion (for a differentially wired Wheatstone bridge) at the rate of 2.5% for a misalignment of 85 nm (3 sigma) between a single flux guiding layer and the sense layer.

The flux guiding layer may be formed from layers typically used in the magnetic random access memory (MRAM) process flow, during which bit and digit lines cladded with a high permeability magnetic material (such as in typical magnetic memory devices), referred to herein as a flux guide, are used to increase the field factors present to reduce the current needed to switch the memory storage element. In the sensor application, the same process flow may be used with the optional additional step of sputtering out the bottom of the digit line in order to remove any cladding present on the trench's bottom. Modifications may be made to the process flow so that the height and width of the cladding used for flux guiding are at optimum values instead of the 500 nm and 25 nm, respectively that are used in the exemplary process described above.

A method and apparatus are subsequently described in more detail for providing multi-axis pinning on a bulk wafer which may be used to form an integrated circuit sensor with different reference layers having three different pinning directions, two of which are substantially orthogonal that are set with a single pinning material deposition and bulk wafer setting procedure. As a preliminary step, a stack of one or more layers of ferromagnetic and antiferromagnetic materials are etched into shaped reference layers having a two-dimensional shape with a high aspect ratio, where the shape provides a distinction for the desired magnetization direction for each reference layer. Depending on the materials and techniques used, the final magnetization direction may be oriented along the short axis or the long axis of the shaped layer. For example, if the pinned layer is formed with a slightly imbalanced synthetic anti-ferromagnet (SAF) patterned into micron-scale dimensions, the magnetization will direct along the short axis. As will be appreciated by those skilled in the art, the SAF embodiment provides a number of benefits related to the use of pinned-SAF reference layers in magnetoelectronic devices. In other embodiments, by controlling the thicknesses of the pinned and fixed layers and the in-plane spatial extent of the patterned structure, the final magnetization may be directed along the long axis. Using shape anisotropy, different magnetization directions are induced in the reference layers by heating in the presence of an orienting field that is aligned between the desired magnetization directions for the reference layers. In selected embodiments, the reference layers are heated sufficiently to reduce the material component of the anisotropy and allow the shape and external field to dominate the magnetization direction. In this manner, once the orienting field is removed, the shape anisotropy directs the magnetization in the desired direction. Upon removing the orienting field, the magnetizations of the reference layers relax to follow the shape of the reference layers so as to induce a magnetization that is aligned along the desired axis of the shaped reference layer. An optional compensating field may be applied to help induce orthogonality, and the reference layers are then heated to above the phase transition temperature of the antiferromagnetic pinning layers. For example, if two reference layers are shaped to have longer dimensions which are perpendicular to one another, then the induced magnetizations for the two reference layers will be close to being perpendicular to one another.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetic sensor design and operation, Magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

FIG. 1 shows a magnetic field sensor 100 formed with first, second, and third differential sensors 101, 111, 121 for detecting the component directions of an applied field along a first axis 120 (e.g., the y-axis direction), a second axis 110 (e.g., the x-axis direction), and a third axis 130 (e.g., the z-axis direction), respectively. The z-axis direction is represented as a dot and cross-hairs as going either into or out of the page on which FIG. 1 is situated. Exemplary embodiments of the first and second sensors 101, 111 are described in detail in U.S. patent application Ser. No. 12/433,679. As depicted herein, each sensor 101, 111, 121 is formed with unshielded sense elements that are connected in a bridge configuration. Thus, the first sensor 101 is formed from the connection of a plurality of sense elements 102-105 in a bridge configuration over a corresponding plurality of pinned layers 106-109, where each of the pinned layers 106-109 is magnetized in the x-axis direction. In similar fashion, the second sensor 111 is formed from the connection of a plurality of sense elements 112-115 in a bridge configuration over a corresponding plurality of pinned layers 116-119 that are each magnetized in the y-axis direction that is perpendicular to the magnetization direction of the pinned layers 106-109. Furthermore, the third sensor 121 in the same plane as the first and second sensors 101, 111 is formed from the connection of a plurality of sense elements 122-125 in a bridge configuration over a corresponding plurality of pinned layers 126-129 that are each magnetized in the xy-axis direction that is at 45 degrees to the magnetization direction of the pinned layers 106-109 and 116-119. In the depicted bridge configuration 101, the sense elements 102, 104 are formed to have a first easy axis magnetization direction and the sense elements 103, 105 are formed to have a second easy axis magnetization direction, where the first and second easy axis magnetization directions are orthogonal with respect to one another and are oriented to differ equally from the magnetization direction of the pinned layers 106-109. As for the second bridge configuration 111, the sense elements 112, 114 have a first easy axis magnetization direction that is orthogonal to the second easy axis magnetization direction for the sense elements 113, 115 so that the first and second easy axis magnetization directions are oriented to differ equally from the magnetization direction of the pinned layers 116-119. In the third bridge configuration 121, the sense elements 122 123,124, and 125 all have an easy axis magnetization direction that is orthogonal to the pinned magnetization direction of the pinned layers 126, 127, 128, and 129. The third bridge configuration 121 further includes flux guides 132-135 positioned adjacent to the right edge of sense elements 122-125, and flux guides 136-139 positioned adjacent to the left edge of sense elements 122-125, respectively. Flux guides 132,137, 134, and 139 are positioned above sense elements 122-125, and flux guides 136, 133, 138, and 135 are positioned below sense elements 122-125. The positioning of these flux guides 132-139 is subsequently described in more detail in FIG. 2. In the depicted sensors 101, 111, 121 there is no shielding required for the sense elements, nor are any special reference elements required. In an exemplary embodiment, this is achieved by referencing each active sense element (e.g., 102, 104) with another active sense element (e.g., 103, 105) using shape anisotropy techniques to establish the easy magnetic axes of the referenced sense elements to be deflected from each other by 90 degrees for the x and y sensors, and referencing a sense element that responds in an opposite manner to an applied field in the Z direction for the Z sensor. The Z sensor referencing will be described in more detail below. The configuration shown in FIG. 1 is not required to harvest the benefits of the third sensor 121 structure described in more detail in FIG. 2, and is only given as an example.

By positioning the first and second sensors 101, 111 to be orthogonally aligned, each with the sense element orientations deflected equally from the sensor's pinning direction and orthogonal to one another in each sensor, the sensors can detect the component directions of an applied field along the first and second axes. Flux guides 132-139 are positioned in sensor 121 above and below the opposite edges of the elements 122-125, in an asymmetrical manner between legs 141, 143 and legs 142, 144. As flux guides 132, 134 are placed above the sense elements 122, 124, the magnetic flux from the Z field may be guided by the flux guides 132 and 134 into the xy plane along the right side and cause the magnetization of sense elements 122 and 124 to rotate in a first direction towards a higher resistance. Similarly, the magnetic flux from the Z field may be guided by the flux guides 133 and 135 into the xy plane along the right side of the sense element and cause the magnetization of sense elements 123 and 125 to rotate in a second direction, opposite from the first direction towards a lower resistance, as these flux guides are located below the sense elements 123, 125. Thus, the sensor 121 can detect the component directions of an applied field along the third axis. Although in the preferred embodiment, the flux guides are in a plane orthogonal to the plane of the field sensor, the flux guides will still function if the angle they make with the sensor is not exactly 90 degrees. In other embodiments, the angle between the flux guide and the field sensor could be in a range from 45 degrees to 135 degrees, with the exact angle chosen depending on other factors such as on the ease of fabrication.

As seen from the foregoing, a magnetic field sensor may be formed from differential sensors 101, 111, 121 which use unshielded sense elements 102-105, 112-115, and sense elements 122-125 with guided magnetic flux connected in a bridge configuration over respective pinned, or reference, layers 106-109, 116-119, and 126-129 to detect the presence and direction of an applied magnetic field. With this configuration, the magnetic field sensor provides good sensitivity, and also provides the temperature compensating properties of a bridge configuration.

The bridge circuits 101, 111, 121 may be manufactured as part of an existing MRAM or thin-film sensor manufacturing process with only minor adjustments to control the magnetic orientation of the various sensor layers and cross section of the flux guiding structures. Each of the pinned layers 106-109, 116-119, and 126-129 may be formed with one or more lower ferromagnetic layers, and each of the sense elements 102-105, 112-125, 122-125 may be formed with one or more upper ferromagnetic layers. An insulating tunneling dielectric layer (not shown) may be disposed between the sense elements 102-105, 112-125, 122-125 and the pinned layers 106-109, 116-119, and 126-129. The pinned and sense electrodes are desirably magnetic materials whose magnetization direction can be aligned. Suitable electrode materials and arrangements of the materials into structures commonly used for electrodes of magnetoresistive random access memory (MRAM) devices and other magnetic tunnel junction (MTJ) sensor devices are well known in the art. For example, pinned layers 106-109, 116-119, and 126-129 may be formed with one or more layers of ferromagnetic and antiferromagnetic materials to a combined thickness in the range 10 to 1000 Å, and in selected embodiments in the range 250 to 350 Å. In an exemplary implementation, each of the pinned layers 106-109, 116-119, and 126-129 is formed with a single ferromagnetic layer and an underlying anti-ferromagnetic pinning layer. In another exemplary implementation, each pinned layer 106-109, 116-119, and 126-129 includes a synthetic anti-ferromagnetic stack component (e.g., a stack of CF (Cobalt Iron), Ruthenium (Ru) and CFB) which is 20 to 80 Å thick, and an underlying anti-ferromagnetic pinning layer that is approximately 200 Å thick. The lower anti-ferromagnetic pinning materials may be re-settable materials, such as IrMn, though other materials, such as PtMn, can be used which are not readily re-set at reasonable temperatures. As formed, the pinned layers 106-109, 116-119, and 126-129 function as a fixed or pinned magnetic layer when the direction of its magnetization is pinned in one direction that does not change during normal operating conditions. As disclosed herein, the heating qualities of the materials used to pin the pinned layers 106-109, 116-119, and 126-129 can change the fabrication sequence used to form these layers.

One of each of the sense elements 102-105, 112-125, 122-125 and one of each of the pinned layers 106-109, 116-119, 126-129 form a magnetic tunnel junction (MTJ) sensor. For example, for bridge circuit 121, sense element 122 and pinned layer 126 form an MTJ sensor 141. Likewise, sense element 123 and pinned layer 127 form an MTJ sensor 142, sense element 124 and pinned layer 128 form an MTJ sensor 143, and sense element 125 and pinned layer 129 form an MTJ sensor 144.

The pinned layers 106-109, 116-119, and 126-129 may be formed with a single patterned ferromagnetic layer having a magnetization direction (indicated by the arrow) that aligns along the long-axis of the patterned reference layer(s). However, in other embodiments, the pinned reference layer may be implemented with a synthetic anti-ferromagnetic (SAF) layer which is used to align the magnetization of the pinned reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings.

The sense elements 102-105, 112-125, 122-125 may be formed with one or more layers of ferromagnetic materials to a thickness in the range 10 to 5000 Å, and in selected embodiments in the range 10 to 60 Å. The upper ferromagnetic materials may be magnetically soft materials, such as NiFe, CoFe, Fe, CFB and the like. In each MTJ sensor, the sense elements 102-105, 112-125, 122-125 function as a sense layer or free magnetic layer because the direction of their magnetization can be deflected by the presence of an external applied field, such as the Earth's magnetic field. As finally formed, sense elements 102-105, 112-125, 122-125 may be formed with a single ferromagnetic layer having a magnetization direction (indicated with the arrows) that aligns along the long-axis of the patterned shapes.

The pinned layers 106-109, 116-119, 126-129 and sense elements 102-105, 112-125, 122-125 may be formed to have different magnetic properties. For example, the pinned layers 106-109, 116-119, 126-129 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. In contrast, the sense elements 102-105, 112-125, 122-125 may be formed with a magnetically soft material to provide different magnetization directions having a comparatively low anisotropy and coercive force so that the magnetization direction of the sense electrode may be altered by an externally applied magnetic field. In selected embodiments, the strength of the pinning field is about two orders of magnitude larger than the anisotropy field of the sense electrodes, although different ratios may be used by adjusting the respective magnetic properties of the electrodes using well known techniques to vary their composition.

The pinned layers 106-109, 116-119, 126-129 in the MTJ sensors are formed to have a shape determined magnetization direction in the plane of the pinned layers 106-109, 116-119, 126-129 (identified by the vector arrows for each sensor bridge labeled "Pinning direction" in FIG. 1). As described herein, the magnetization direction for the pinned layers 106-109, 116-119, 126-129 may be obtained using shape anisotropy of the pinned electrodes, in which case the shapes of the pinned layers 106-109, 116-119, 126-129 may each be longer in the pinning direction for a single pinned layer. Alternatively, for a pinned SAF structure, the reference and pinned layers may be shorter along the pinning direction. In particular, the magnetization direction for the pinned layers 106-109, 116-119, 126-129 may be obtained by first heating the shaped pinned layers 106-109, 116-119, 126-129 in the presence of a orienting magnetic field which is oriented non-orthogonally to the axis of longest orientation for the shaped pinned layers 106-109, 116-119, 126-129 such that the applied orienting field includes a field component in the direction of the desired pinning direction for the pinned layers 106-109, 116-119, 126-129. The magnetization directions of the pinned layers are aligned, at least temporarily, in a predetermined direction. However, by appropriately heating the pinned layers during this treatment and removing the orienting field without reducing the heat, the magnetization of the pinned layers relaxes along the desired axis of orientation for the shaped pinned pinned layers 106-109, 116-119, 126-129. Once the magnetization relaxes, the pinned layers can be annealed and/or cooled so that the magnetic field direction of the pinned electrode layers is set in the desired direction for the shaped pinned layers 106-109, 116-119, 126-129.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photoresist as a template.

Figure 2:
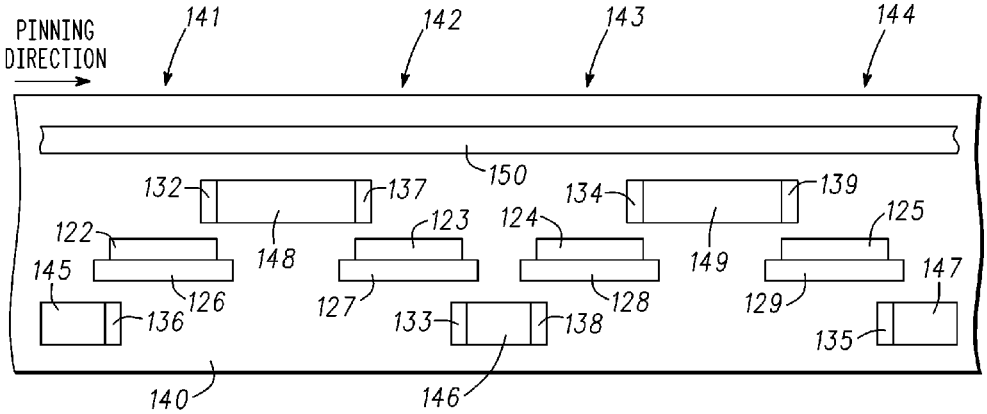
FIG. 2 is a partial cross section of the Z axis bridge structure of FIG. 1 in accordance with the exemplary embodiment.

Referring to FIG. 2 and in accordance with an exemplary embodiment of the present invention, the structure of the MTJ devices 141-144 of the third bridge circuit 121 include the pinned layers 126-129, the sense elements 122-125, and the flux guides 132-139, all formed within the dielectric material 140. The flux guide 136 is positioned adjacent a line 145 and has an end positioned below an edge of the sensor element 122. The flux guides 133 and 138 are positioned on opposed sides of a line 146 and have ends positioned below edges of the sensor elements 123 and 124, respectively. The flux guide 135 is positioned adjacent a line 147 and has an end positioned below an edge of the sensor element 125. The flux guides 132 and 137 are spaced apart by an upper line 148 and have ends positioned above edges of the sensor elements 122 and 123, respectively, and the flux guides 134 and 139 are spaced apart by an upper line 149 and have ends positioned above edges of the sensor elements 134 and 139, respectively. The lines 145-149, are preferably copper, but in some embodiments may be a dielectric. A metal stabilization line 150 is positioned above the MTJ devices 141-144 for providing a stabilization field to the sense elements. The ends of the flux guides may be brought as close as possible to the sensor elements, with a preferable spacing of less than or equal to 250 nm between the two. The sense elements are brought as close as possible for the tightest density array, preferably less than 2.5 um apart.

Figure 3:
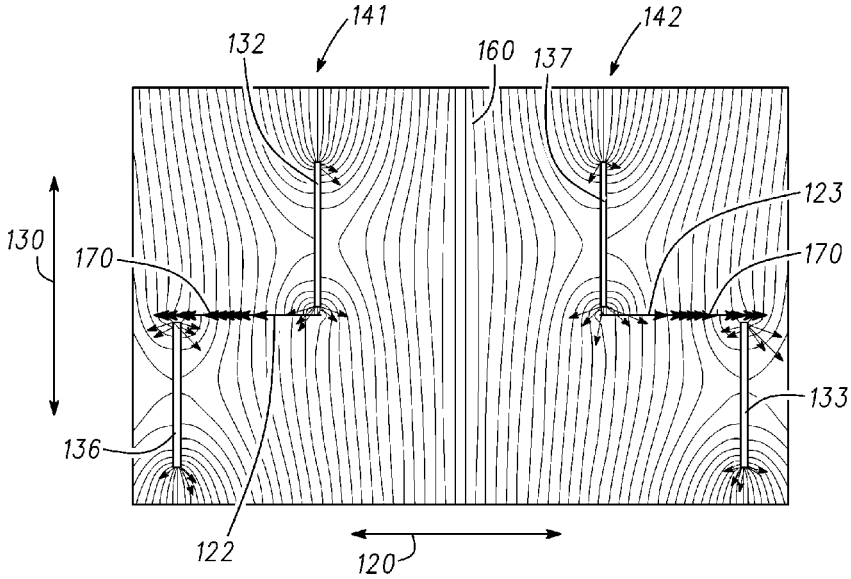
FIG. 3 is a view of flux lines as calculated by finite element simulation of two of the four magnetic tunnel junction sensors of FIG. 2.

FIG. 3 is a view of flux lines as calculated by finite element simulation of MTJ devices 141, 142 of FIG. 2 with a magnetic field in the z direction imparted upon the sense elements 122-123. FEM modeling shows the resultant magnetic flux lines 160, exhibiting a component in the plane of the sensor. MTJ device 141 is represented by flux guides 132 and 136 on opposed ends of the sensing element 122. MTJ device 142 is represented by flux guides 133 and 137 on opposed ends of the sensing element 123. Stated otherwise, sensing element 122 extends from flux guides 132 and 136, and sensing element 123 extends from flux guides 133 and 137. The magnetic field 160 in the Z-axis 130 produces an asymmetric response in the sensing elements 122, 123 along the X-axis 120 as indicated by the arrows 170. In this manner, for a field 160 in the Z direction 130 directed towards the bottom of the page, the magnetization of sense element 122 rotates away from the pinning direction (and to higher resistance) of the pinned layer 126, while the magnetization of sense element 123 rotates towards the pinning direction (and to lower resistance) of pinned layer 127. For a field in the X direction 120, both elements 122, 123 show induced magnetization in the same direction (towards higher or lower resistance). Therefore, by wiring MTJ elements 141, 142 in a Wheatstone bridge for differential measurement and subtracting the resistances of MTJ devices 141, 142, the X field response is eliminated and twice the Z field response is measured.

Referring again to FIG. 2, in the case of an exposure to a large magnetic field which may induce magnetization disturbances and domain structure in the flux guides 132-139, a large current pulse may be introduced along metal lines 145-149 to reset the flux guide domain structure.

Figure 4:
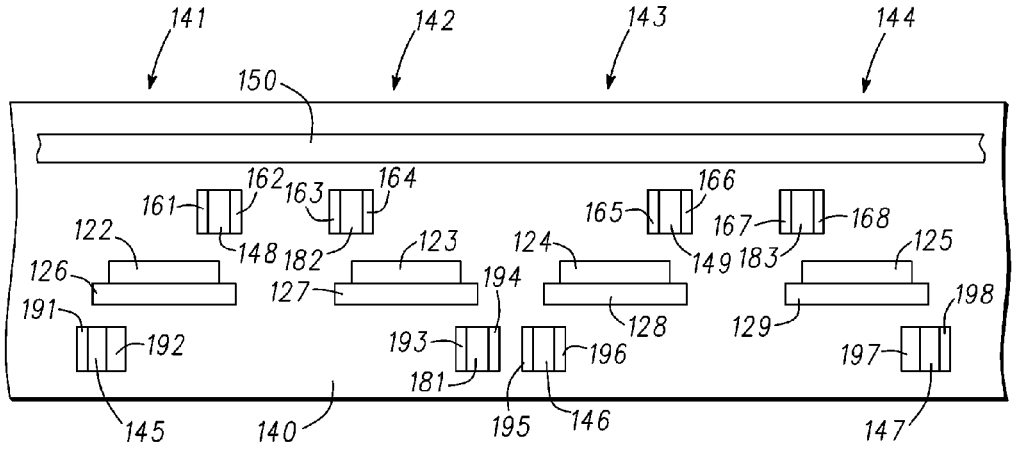
FIG. 4 is a partial cross section of the Z axis bridge structure of FIG. 1 in accordance with another exemplary embodiment.

In another exemplary embodiment (shown in FIG. 4), each of the cladded lines 145-149 are divided into two independent metal lines, and additional non-flux guiding cladding (161-168 and 191-198) is placed in between these two metal lines at the interior edges. For sensor 141, the flux guide 161 on the left edge of the left metal line, 148 guides Z field flux into the sense element 122 to its left, and the flux guide 192 on the right most edge of the right metal line 145 guides Z field flux into the sense element 122 on its right. Sensors 142-144 function similarly, with the cladded edge of the metal line adjacent to each sense element serving the active flux guiding function. As these lines are separated, a current may be made to pass through cladded lines 145, 146, 182 and 183 into the page, and 181, 147, 148, and 149 out of the page to create a magnetic field along the cladded line edges with a Z component pointing in a consistent direction (down in this example). These current orientations can serve to create a magnetic field with a strong component in the Z direction, which, through a calibration for the geometry can serve as a self test for the functionality and sensitivity of the Z axis response.

Another exemplary embodiment (see FIG. 5) includes extensions 152-159 integrally formed with the flux guides 132-139. The extensions 152-159 extend along the same axis as the sensor elements 122-125 and accentuate the horizontal component of the flux guide and move the horizontal component more to the center of the appropriate sense element 122-125.

Figure 5:
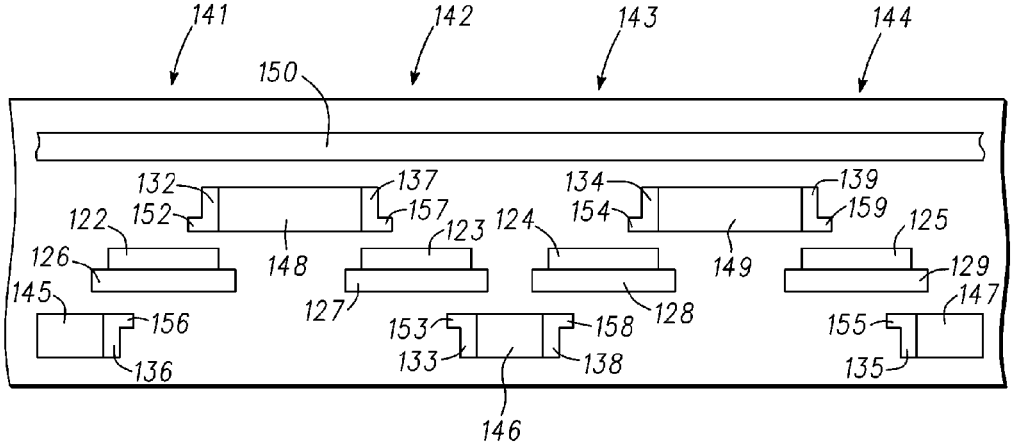
FIG. 5 is a partial cross section of the Z axis bridge structure of FIG. 1 in accordance with yet another exemplary embodiment.
Figure 6:
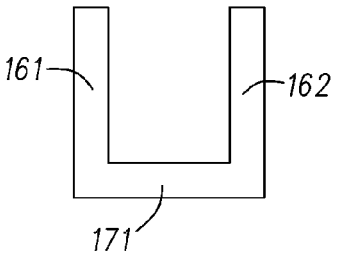
FIG. 6 is another shape of a flux guide as shown in FIG. 5.
Figure 7:
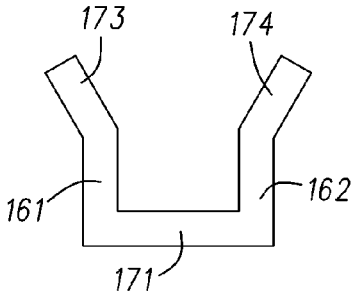
FIG. 7 is yet another shape of the flux guide as shown in FIG. 5.
Figure 8:
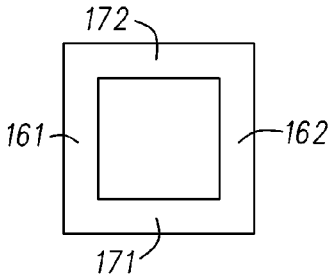
FIG. 8 is still another shape of the flux guide as shown in FIG. 5.

While various exemplary embodiments have been shown for the flux guides, including the vertical elements 132-139 of FIG. 2, and the "L" shaped flux guides including extensions 152-159 of FIG. 5, other exemplary embodiments may be used for both upper and lower flux guides, such as box shaped or "U" shaped flux guides. In the "U" shaped structure (FIG. 6), a horizontal NiFe segment 171 connects the two vertical segments 161, 162 along the bottom metal line, while in the box shaped structure (FIG. 7), a horizontal segment 172 connects the two vertical segments both above the metal line as well. A horizontal segment helps to couple the magnetic structure of the two vertical segments, increasing the field conversion factor by 10-20% over that of two isolated vertical flux guides. Two horizontal segments of the box like structure provide better coupling and increase the field conversion factor by twenty to forty percent over a simple vertical flux guide. Additionally, the vertical segments of the "U" shaped structure of FIG. 6 may be flared 173, 174 (FIG. 8) out so that the region near the sense element edge has a horizontal component. Similar to the L shaped guides, the flared segments guide the magnetic flux so that there is a component directly in the plane of the magnetic sensor to further amplify the field conversion factor. However, care must be taken that the overlay is not too great or the magnetic flux will be shielded from the sensor.

Figure 9:
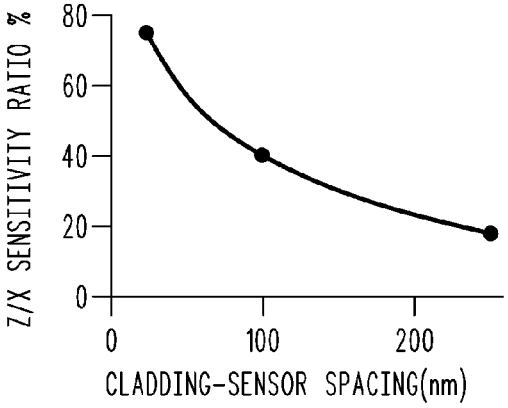
FIG. 9 is a graph illustrating the Z sensitivity expressed as a percentage of the X sensitivity for a single (not differentially wired) MTJ sense element as a function of the cladding to sensor spacing.

FIG. 9 is a graph showing the Z/X sensitivity ratio versus the cladding/sensor spacing for a 25 nm wide, 500 nm tall vertical segments placed above and below the sense element. The Z/X sensitivity increases, to about 75 percent, as the cladding is brought to 25 nanometers of distance. Additional factors may be gained through cross sectional changes such as those highlighted above, or through aspect ratio improvements in the flux guide, for example, making the guide taller and increasing the aspect ratio will linearly increase the Z/X sensitivity ratio. Therefore, it is important to bring the flux guide as close as possible to the sense element, and increase its aspect ratio as much as is possible without adversely impacting the magnetic microstructure.

Although the described exemplary embodiments disclosed herein are directed to various sensor structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A ferromagnetic thin-film based magnetic field sensor comprising:

a substrate having a planar surface; [and]

a first magnetoresistive sensor comprising:

a first sensing element having [a] first [side] *and second sides* lying parallel to the planar surface of the substrate, [the first sensing element having a second side opposed to the first side and having] *wherein the first side is defined by at least* first and second opposed edges; and a first flux guide comprising a soft ferromagnetic material*, a first flux guide side, and a second flux guide side, wherein the second flux guide side is orthogonal to the first flux guide side, the second flux guide side is* disposed non-parallel to the first side of the first sensing element, and [having] *the second flux guide side includes* an end that is proximate to the first edge and the first side of the first sensing element,

*wherein the first side of the first sensing element extends in a first plane, the planar surface of the substrate extends in a second plane parallel to the first plane, and the first flux guide side extends in a third plane parallel to and spaced apart from each of the first and second planes; and*

*a second magnetoresistive sensor comprising:*

*a second sensing element having first and second sides lying parallel to the planar surface of the substrate, wherein the first side of the second sensing element extends in the first plane,*

*wherein the first magnetoresistive sensor detects a magnetic field in a first direction orthogonal to the planar surface, and the second magnetoresistive sensor detects a magnetic field in a second direction parallel to the planar surface.*

[2. The ferromagnetic thin-film based magnetic field sensor of claim 1 wherein the first magnetoresistive sensor further comprises:

a second flux guide comprising a soft ferromagnetic material disposed non-parallel to the first side of the first sensing element and having an end that is proximate to the second edge and the second side of the first sensing element.]

[3. The ferromagnetic thin-film based magnetic field sensor of claim 1 wherein the first magnetoresistive sensor comprises one of an array of ferromagnetic thin-film based magnetic field sensors.]

[4. The ferromagnetic thin-film based magnetic field sensor of claim 1 wherein the first flux guide comprises a high aspect ratio structure non-parallel to the first sense element.]

[5. The ferromagnetic thin-film based magnetic field sensor of claim 1 wherein the first flux guide comprises a U shaped element.]

[6. The ferromagnetic thin-film based magnetic field sensor of claim 1 wherein the first flux guide includes a flared end.]

[7. The ferromagnetic thin-film based magnetic field sensor of claim 1 further comprising a material disposed adjacent the first flux guide and comprising one of the group consisting of a high conductivity metal and a dielectric material.]

[8. The ferromagnetic thin-film based magnetic field sensor of claim 1 wherein the first flux guide comprises a box shaped structure.]

[9. The ferromagnetic thin-film based magnetic field sensor of claim 1 wherein at least one of the first and second flux guides is disposed substantially orthogonal to the plane of the substrate.]

[10. The ferromagnetic thin-film based magnetic field sensor of claim 1 wherein at least one of the first and second flux guides is disposed at an angle of between 45 degrees and 90 degrees to the plane of the substrate.]

11. The ferromagnetic thin-film based magnetic field sensor of claim 1 [further comprising: a second magnetoresistive sensor having a second sensing element for detecting a magnetic field in a second direction orthogonal to the first direction; and], *wherein the magnetic field sensor further comprises:* a third magnetoresistive sensor [having a third sensing element orthogonal to the second sensing element for detecting] *comprising:*

*a third sensing element having first and second sides lying parallel to the planar surface of the substrate, wherein the first side of the third sensing element extends in the first plane, and*

*wherein the third magnetoresistive sensor detects* a magnetic field in a third direction orthogonal to the first and second directions, wherein the third [sensing element is in a plane with the first and second sensing elements] *direction is parallel to the planar surface.*

12. The ferromagnetic thin-film based magnetic field sensor of claim 11, wherein *each of* the first, second, and third [sensor] *sensing* elements [each] comprise an imbalanced synthetic antiferromagnet formed with first and second ferromagnetic layers separated by a spacer layer, [where] *wherein* the first and second ferromagnetic layers have different magnetic moments.

13. The ferromagnetic thin-film based magnetic field sensor of claim 1 [further comprising:], *wherein* the first magnetoresistive sensor [comprising:] *further comprises* a first pinned layer[; a],

*wherein the* second magnetoresistive sensor [comprising:] *further comprises* a second pinned layer[;], and [a] *the* second sensing element *is* formed on the second pinned layer[;], *and*

*wherein the magnetic field sensor further comprises:* a third magnetoresistive sensor comprising:

a third pinned layer; and a third sensing element formed on the third pinned layer [and], *which is* orthogonal to *a pinned layer of* the second sensing element[;], *wherein the third sensing element includes first and second sides lying parallel to the planar surface of the substrate, and wherein the first side of the third sensing element extends in the first plane, and* wherein the second and third pinned layers are oriented about 45 degrees to the first pinned layer.

14. The ferromagnetic thin-film based magnetic field sensor of claim [13] *1,* wherein the first [magnetic tunnel junction] *magnetoresistive sensor* further comprises:

a second flux guide *having a first flux guide side and a second flux guide side, wherein the second flux guide side is orthogonal to the first flux guide side, the second flux guide side is* disposed non-parallel to the first side of the first sensing element, and [having] an end [that] *of the second flux guide side* is proximate to the second edge and the second side of the first sensing element,

*wherein the first flux guide side of the second flux guide is disposed in a fourth plane parallel to and spaced apart from each of the first, second, and third planes.*

15. The ferromagnetic thin-film based magnetic field sensor of claim 14, wherein the first and second flux guides each comprise an aspect ratio greater than 10.

16. A ferromagnetic thin-film *based* magnetic field sensor comprising:

a first bridge circuit comprising first, second, third, and fourth magnetic tunnel junction sensors coupled as a Wheatstone bridge for sensing a magnetic field orthogonal to [the] *a* plane of the sensors;

the first magnetic tunnel junction sensor comprising:

a first reference layer; and a first sensing element formed on the first reference layer, the first sensing element having first and second edges and first and second sides; and a first flux guide comprising a soft ferromagnetic material disposed orthogonal to and spaced from the first edge and the first side of the first sensing element;

the second magnetic tunnel junction sensor comprising:

a second reference layer; and a second sensing element formed on the second reference layer, the second sensing element having first and second edges and first and second sides; and a second flux guide comprising a soft ferromagnetic material disposed orthogonal to and spaced from the first edge and the first side of the second sensing element;

the third magnetic tunnel junction sensor comprising:

a third reference layer; and a third sensing element formed on the third reference layer, the third sensing element having first and second edges and first and second sides; and a third flux guide comprising a soft ferromagnetic material disposed orthogonal to and spaced from the first edge and the first side of the third sensing element;

the fourth magnetic tunnel junction sensor comprising:

a fourth reference layer; and a fourth sensing element formed on the fourth reference layer, the fourth sensing element having first and second edges and first and second sides; and a fourth flux guide disposed orthogonal to and spaced from the first edge and the first side of the fourth sensing element.

17. The ferromagnetic thin-film based magnetic field sensor of claim 16, wherein the first, second, third, and fourth magnetic tunnel junction sensors further comprise fifth, sixth, seventh, and eighth flux guides disposed orthogonal to and spaced from the second edge and the second side of the first, second, third, and fourth sensing elements, respectively.

18. The ferromagnetic thin-film based magnetic field sensor of claim 16, further comprising:

a second bridge circuit comprising fifth, sixth, seventh, and eighth magnetic tunnel junction sensors coupled as a second Wheatstone bridge for sensing a magnetic field in a second direction orthogonal to the first direction; and a third bridge circuit comprising ninth, tenth, eleventh, and twelfth magnetic tunnel junction sensors coupled as a third Wheatstone bridge for sensing a magnetic field in a third direction orthogonal to the first and second directions.

[19. The ferromagnetic thin-film based magnetic field sensor of claim 16 wherein each of the first, second, third, and fourth sensors comprises an array of sense elements.]

[20. A method of testing the functionality and sensitivity of a response of the Z axis of a ferromagnetic thin-film magnetic field sensor including a substrate having a planar surface, and a first magnetoresistive sensor comprising a sensing element having a first side lying parallel to the planar surface of the substrate, the sensing element having a second side opposed to the first side and having first and second opposed edges, a first flux guide comprising a soft ferromagnetic material disposed non-parallel to the first side of the substrate and having an end that is proximate to the first edge and the first side of the sensing element, and a metal line formed adjacent contiguous to the flux guide, the method comprising:

applying a current through the metal line to provide a magnetic field with a component parallel to the plane of the flux guides.]

[21. The method of claim 20, further comprising:

applying a current pulse through the metal line to reset the flux guide domain structure.]

*22. The ferromagnetic thin-film based magnetic field sensor of claim 14, wherein the first flux guide is disposed closer to the first side of the first sensing element than the second side of the first sensing element, and the second flux guide is disposed closer to the second side of the first sensing element than the first side of the first sensing element.*

*23. The ferromagnetic thin-film based magnetic field sensor of claim 1, wherein the first flux guide side includes a first dimension and a second dimension longer than the first dimension, the second flux guide side includes a third dimension and a fourth dimension longer than the third dimension, and the third dimension is orthogonal to the first dimension.*

*24. The ferromagnetic thin-film based magnetic field sensor of claim 23, wherein the second dimension and the fourth dimension are equal.*

*25. The ferromagnetic thin-film based magnetic field sensor of claim 1, wherein the first flux guide includes a width dimension, a height dimension greater than the width dimension, and a depth dimension greater than the height dimension.*

*26. The ferromagnetic thin-film based magnetic field sensor of claim 25, wherein the second flux guide side is defined by the height dimension and the depth dimension.*

*27. The ferromagnetic thin-film based magnetic field sensor of claim 26, wherein the first flux guide side is defined by the width dimension and the depth dimension.*

*28. The ferromagnetic thin-film based magnetic field sensor of claim 1, wherein the third plane is in between the first and second planes.*

*29. The ferromagnetic thin-film based magnetic field sensor of claim 1, wherein the first plane is spaced apart from the second plane.*

*30. The ferromagnetic thin-film based magnetic field sensor of claim 1, wherein the first flux guide side is closer to the first side of the sensing element than the second side of the sensing element.*

*31. The ferromagnetic thin-film based magnetic field sensor of claim 1, wherein an entirety of the first flux guide is positioned closer to the first side of the first sensing element than the second side of the first sensing element.*

*32. The ferromagnetic thin-film based magnetic field sensor of claim 1, wherein the end of the second flux guide side is closer to the first side of the first sensing element than the second side of the first sensing element.*

*33. The ferromagnetic thin-film based magnetic field sensor of claim 1, wherein the end of the second flux guide side is closer to the first edge of the first sensing element than the second edge of the first sensing element.*

*34. The ferromagnetic thin-film based magnetic field sensor of claim 1, wherein an entirety of the first flux guide includes a one-piece construction.*

*35. The ferromagnetic thin-film based magnetic field sensor of claim 1, wherein the first flux guide is configured to guide a magnetic field orthogonal to the first side of the first sensing element into a plane parallel to the first side of the first sensing element.*

*36. The ferromagnetic thin-film based magnetic field sensor of claim 1, wherein the first magnetoresistive sensor is formed within a thickness of the substrate.*

*37. The ferromagnetic thin-film based magnetic field sensor of claim 1, further comprising:*

*a third magnetoresistive sensor including:*

*a third sensing element having first and second sides lying parallel to the planar surface of the substrate, wherein the first side of the third sensing element extends in the first plane.*

*38. The ferromagnetic thin-film based magnetic field sensor of claim 1, wherein the soft ferromagnetic material includes nickel iron.*

*39. The magnetic field sensor of claim 1, wherein an entirety of the first flux guide is in between the planar surface and the first sensing element.*

*40. A ferromagnetic thin-film based magnetic field sensor comprising:*

*a substrate having a planar surface;*

*a first magnetoresistive sensor comprising:*

*a first sensing element having first and second sides lying parallel to the planar surface of the substrate,*

*wherein the first side is defined by at least first and second opposed edges; and*

*a first flux guide comprising a high permeability magnetic material, a first flux guide side, and a second flux guide side, wherein the second flux guide side is orthogonal to the first flux guide side, the second flux guide side is disposed non-parallel to the first side of the first sensing element, and the second flux guide side includes an end that is proximate to the first edge and the first side of the first sensing element,*

*wherein the first side of the first sensing element extends in a first plane, the planar surface of the substrate extends in a second plane parallel to the first plane, and the first flux guide side extends in a third plane parallel to and spaced apart from each of the first and second planes; and*

*a second magnetoresistive sensor comprising:*

*a second sensing element having first and second sides lying parallel to the planar surface of the substrate, wherein the first side of the second sensing element extends in the first plane,*

*wherein the first magnetoresistive sensor detects a magnetic field in a first direction orthogonal to the planar surface, and the second magnetoresistive sensor detects a magnetic field in a second direction parallel to the planar surface.*

*41. The ferromagnetic thin-film based magnetic field sensor of claim 40, wherein the high permeability magnetic material includes nickel iron.*

*42. The ferromagnetic thin-film based magnetic field sensor of claim 40, further comprising:*

*a third magnetoresistive sensor comprising:*

*a third sensing element having first and second sides lying parallel to the planar surface of the substrate, wherein the first side of the third sensing element extends in the first plane, and*

*wherein the third magnetoresistive sensor detects a magnetic field in a third direction orthogonal to the first and second directions.*

*43. The ferromagnetic thin-film based magnetic field sensor of claim 42, wherein each of the first, second, and third sensing elements comprise an imbalanced synthetic antiferromagnet formed with first and second ferromagnetic layers separated by a spacer layer, where the first and second ferromagnetic layers have different magnetic moments.*

*44. The ferromagnetic thin-film based magnetic field sensor of claim 40, wherein the first magnetoresistive sensor further comprises a first pinned layer,*

*wherein the second magnetoresistive sensor further comprises a second pinned layer, and the second sensing element is formed on the second pinned layer, and*

*wherein the magnetic field sensor further comprises:*

*a third magnetoresistive sensor comprising:*

*a third pinned layer; and*

*a third sensing element formed on the third pinned layer, which is orthogonal to a pinned layer of the second sensing element, wherein the third sensing element includes first and second sides lying parallel to the planar surface of the substrate, and wherein the first side of the third sensing element extends in the first plane,*

*wherein the second and third pinned layers are oriented about 45 degrees to the first pinned layer.*

*45. The ferromagnetic thin-film based magnetic field sensor of claim 40, wherein the first magnetoresistive sensor further comprises:*

*a second flux guide having a first flux guide side and a second flux guide side, wherein the second flux guide side is orthogonal to the first flux guide side, the second flux guide side is disposed non-parallel to the first side of the first sensing element, and an end of the second flux guide side is proximate to the second edge and the second side of the first sensing element,*

*wherein the first flux guide side of the second flux guide extends in a fourth plane parallel to and spaced apart from each of the first, second, and third planes.*

*46. The ferromagnetic thin-film based magnetic field sensor of claim 45, wherein the first and second flux guides each comprise an aspect ratio greater than 10.*

*47. The ferromagnetic thin-film based magnetic field sensor of claim 45, wherein the first flux guide is disposed closer to the first side of the first sensing element than the second side of the first sensing element, and the second flux guide is disposed closer to the second side of the first sensing element than the first side of the first sensing element.*

*48. The ferromagnetic thin-film based magnetic field sensor of claim 40, wherein the first flux guide side includes a first dimension and a second dimension longer than the first dimension, the second flux guide side includes a third dimension longer than a fourth dimension, wherein the third dimension is orthogonal to the first dimension.*

*49. The ferromagnetic thin-film based magnetic field sensor of claim 48, wherein the second dimension and the fourth dimension are equal.*

*50. The ferromagnetic thin-film based magnetic field sensor of claim 40, wherein the third plane is in between the first and second planes.*

*51. A ferromagnetic thin-film based magnetic field sensor comprising:*

*a first bridge circuit comprising first, second, third, and fourth magnetic tunnel junction sensors coupled as a Wheatstone bridge for sensing a magnetic field orthogonal to a plane of the sensors;*

*the first magnetic tunnel junction sensor comprising:*

*a first reference layer; and*

*a first sensing element formed on the first reference layer, the first sensing element having first and second edges and first and second sides; and*

*a first flux guide comprising a high permeability magnetic material disposed orthogonal to and spaced from the first edge and the first side of the first sensing element;*

*the second magnetic tunnel junction sensor comprising:*

*a second reference layer; and*

*a second sensing element formed on the second reference layer, the second sensing element having first and second edges and first and second sides; and*

*a second flux guide comprising a high permeability magnetic material disposed orthogonal to and spaced from the first edge and the first side of the second sensing element;*

*the third magnetic tunnel junction sensor comprising:*

*a third reference layer; and*

*a third sensing element formed on the third reference layer, the third sensing element having first and second edges and first and second sides; and*

*a third flux guide comprising a high permeability magnetic material disposed orthogonal to and spaced from the first edge and the first side of the third sensing element;*

*the fourth magnetic tunnel junction sensor comprising:*

*a fourth reference layer; and*

*a fourth sensing element formed on the fourth reference layer, the fourth sensing element having first and second edges and first and second sides; and*

*a fourth flux guide disposed orthogonal to and spaced from the first edge and the first side of the fourth sensing element.*

*52. The magnetic field sensor of claim 51, wherein the first, second, third, and fourth magnetic tunnel junction sensors further comprise fifth, sixth, seventh, and eighth flux guides disposed orthogonal to and spaced from the second edge and the second side of the first, second, third, and fourth sensing elements, respectively.*

*53. The ferromagnetic thin-film based magnetic field sensor of claim 51, further comprising:*

*a second bridge circuit comprising fifth, sixth, seventh, and eighth magnetic tunnel junction sensors coupled as a second Wheatstone bridge for sensing a magnetic field in a second direction orthogonal to the first direction; and*

*a third bridge circuit comprising ninth, tenth, eleventh, and twelfth magnetic tunnel junction sensors coupled as a third Wheatstone bridge for sensing a magnetic field in a third direction orthogonal to the first and second directions.*

*54. The ferromagnetic thin-film based magnetic field sensor of claim 53, wherein the second and third directions are parallel to the plane of sensors.*

*55. A ferromagnetic thin-film based magnetic field sensor comprising:*

*a substrate having a planar surface;*

*a first magnetoresistive sensor comprising:*

*a first sensing element having first and second sides lying parallel to the planar surface of the substrate; and*

*a first flux guide comprising a soft ferromagnetic material, having a first flux guide side and a second flux guide side, wherein the second flux guide side is orthogonal to the first flux guide side, the second flux guide side is disposed non-parallel to the first side of the first sensing element, and the second flux guide side includes an end that is proximate to an edge of the first side of the first sensing element;*

*a second magnetoresistive sensor comprising:*

*a second sensing element having first and second sides lying parallel to the planar surface of the substrate; and*

*a third magnetoresistive sensor comprising:*

*a third sensing element having first and second sides lying parallel to the planar surface of the substrate,*

*wherein the first magnetoresistive sensor detects a magnetic field in a first direction, the second magnetoresistive sensor detects a magnetic field in a second direction orthogonal to the first direction, and the third magnetoresistive sensor detects a magnetic field in a third direction orthogonal to the first and second directions, wherein the first direction is orthogonal to the planar surface, and the second and third directions are parallel to the planar surface, and*

*wherein each of the first, second, and third sensing elements includes a sense axis parallel to the planar surface.*

*56. The ferromagnetic thin-film based magnetic field sensor of claim 55, wherein the first side of the first sensing element is in a first plane, the planar surface of the substrate is in a second plane parallel to the first plane, and the first flux guide side is in a third plane parallel to and spaced apart from each of the first and second planes, and wherein the third plane is in between the first and second planes.*

*57. The ferromagnetic thin-film based magnetic field sensor of claim 55, wherein an entirety of the first flux guide is positioned closer to the first side of the first sensing element than the second side of the first sensing element.*

*58. The ferromagnetic thin-film based magnetic field sensor of claim 57, wherein the first magnetoresistive sensor further comprises:*

*a second flux guide positioned non-parallel to the first side of the first sensing element,*

*wherein an entirety of the second flux guide is positioned closer to the second side of the first sensing element than the first side of the first sensing element.*

*59. The ferromagnetic thin-film based magnetic field sensor of claim 55, wherein an entirety of the first flux guide is positioned in between the first side of the first sensing element and the planar surface of the substrate.*

*60. The ferromagnetic thin-film based magnetic field sensor of claim 55, wherein the soft ferromagnetic material includes nickel iron.*

*61. The ferromagnetic thin-film based magnetic field sensor of claim 55, wherein the first flux guide is configured to guide a magnetic field orthogonal to the first side of the first sensing element into a plane parallel to the first side of the first sensing element.*

*62. The ferromagnetic thin-film based magnetic field sensor of claim 55, wherein the first magnetoresistive sensor is formed within a thickness of the substrate.*

*63. The ferromagnetic thin-film based magnetic field sensor of claim 55, wherein each of the first, second, and third sensing elements includes an imbalanced synthetic antiferromagnet formed with first and second ferromagnetic layers separated by a spacer layer, where the first and second ferromagnetic layers have different magnetic moments.*

*64. The ferromagnetic thin-film based magnetic field sensor of claim 55, wherein an entirety of the first flux guide includes a one-piece construction.*

*65. A ferromagnetic thin-film based magnetic field sensor comprising:*

*a substrate having a planar surface;*

*a first magnetoresistive sensor comprising:*

*a first sensing element having first and second sides lying parallel to the planar surface of the substrate; and*

*a first flux guide comprising a high permeability magnetic material, having a first flux guide side and a second flux guide side, wherein the second flux guide side is orthogonal to the first flux guide side, the second flux guide side is disposed non-parallel to the first side of the first sensing element, and the second flux guide side includes an end that is proximate to an edge of the first side of the first sensing element;*

*a second magnetoresistive sensor comprising:*

*a second sensing element having first and second sides lying parallel to the planar surface of the substrate; and*

*a third magnetoresistive sensor comprising:*

*a third sensing element having first and second sides lying parallel to the planar surface of the substrate,*

*wherein the first magnetoresistive sensor detects a magnetic field in a first direction, the second magnetoresistive sensor detects a magnetic field in a second direction orthogonal to the first direction, and the third magnetoresistive sensor detects a magnetic field in a third direction orthogonal to the first and second direc-*

*tions, wherein the first direction is orthogonal to the planar surface, and the second and third directions are parallel to the planar surface, and*

*wherein each of the first, second, and third sensing elements includes a sense axis parallel to the planar surface.*

*66. The ferromagnetic thin-film based magnetic field sensor of claim 65, wherein the first side of the first sensing element is in a first plane, the planar surface of the substrate is in a second plane parallel to the first plane, and the first flux guide side is in a third plane parallel to and spaced apart from each of the first and second planes, and wherein the third plane is in between the first and second planes.*

*67. The ferromagnetic thin-film based magnetic field sensor of claim 65, wherein an entirety of the first flux guide is positioned closer to the first side of the first sensing element than the second side of the first sensing element.*

*68. The ferromagnetic thin-film based magnetic field sensor of claim 67, wherein the first magnetoresistive sensor further comprises:*

*a second flux guide positioned non-parallel to the first side of the first sensing element,*

*wherein an entirety of the second flux guide is positioned closer to the second side of the first sensing element than the first side of the first sensing element.*

*69. The ferromagnetic thin-film based magnetic field sensor of claim 65, wherein an entirety of the first flux guide is positioned in between the first side of the first sensing element and the planar surface of the substrate.*

*70. The ferromagnetic thin-film based magnetic field sensor of claim 65, wherein the high permeability magnetic material includes nickel iron.*

*71. The ferromagnetic thin-film based magnetic field sensor of claim 65, wherein the first flux guide is configured to guide a magnetic field orthogonal to the first side of the first sensing element into a plane parallel to the first side of the first sensing element.*

*72. The ferromagnetic thin-film based magnetic field sensor of claim 65, wherein the first magnetoresistive sensor is formed within a thickness of the substrate.*

* * * * *